United States Patent
Chio et al.

(10) Patent No.: US 10,916,580 B2
(45) Date of Patent: Feb. 9, 2021

(54) OPTOELECTRONIC DEVICE WITH LIGHT-EMITTING DIODES

(71) Applicant: Aledia, Grenoble (FR)

(72) Inventors: Zheng-Sung Chio, Melaka (MY); Wei Sin Tan, Meylan (FR); Vincent Beix, Fontaine (FR); Philippe Gilet, Teche (FR); Pierre Tchoulfian, Grenoble (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 16/475,066

(22) PCT Filed: Dec. 28, 2017

(86) PCT No.: PCT/EP2017/084776
§ 371 (c)(1),
(2) Date: Jun. 28, 2019

(87) PCT Pub. No.: WO2018/122354
PCT Pub. Date: Jul. 5, 2018

(65) Prior Publication Data
US 2019/0326351 A1    Oct. 24, 2019

(30) Foreign Application Priority Data
Dec. 29, 2016  (FR) ..................... 16 63509

(51) Int. Cl.
*H01L 33/00* (2010.01)
*H01L 33/32* (2010.01)
(Continued)

(52) U.S. Cl.
CPC ............ *H01L 27/156* (2013.01); *H01L 25/18* (2013.01); *H01L 25/50* (2013.01);
(Continued)

(58) Field of Classification Search
CPC .................................................. H01L 27/156
See application file for complete search history.

(56) References Cited

U.S. PATENT DOCUMENTS 7,554,126 B2 * 6/2009 Higashi .................. H01L 33/38
257/79
9,059,339 B1 * 6/2015 Bayram .................. H01L 33/42
(Continued)

FOREIGN PATENT DOCUMENTS

DE   10 2008 016 534 A1   10/2009
DE   10 2014 112 551 A1    3/2016
(Continued)

OTHER PUBLICATIONS

International Preliminary Report on Patentability for International Application No. PCT/EP2017/084776, dated Jul. 11, 2019.
(Continued)

*Primary Examiner* — William A Harriston
(74) *Attorney, Agent, or Firm* — Wolf, Greenfield & Sacks, P.C.

(57) ABSTRACT

A method of manufacturing an optoelectronic device, comprising the successive steps of: providing a substrate at least partially made of a semiconductor material and having first and second opposite faces; forming a stack of semiconductor layers on the first face, said stack including third and fourth opposite faces, the fourth face being on the side of the substrate, said stack including light-emitting diodes; forming through openings in the substrate from the side of the second face, said openings being opposite at least part of the light-emitting diodes and delimiting walls in the substrate; forming conductive pads on the fourth face in at least some of the openings in contact with the stack; and forming photoluminescent blocks in at least some of the openings.

18 Claims, 8 Drawing Sheets

(51) Int. Cl.
*H01L 33/38* (2010.01)
*H01L 33/42* (2010.01)
*H01L 33/44* (2010.01)
*H01L 33/50* (2010.01)
*H01L 33/62* (2010.01)
*H01L 27/15* (2006.01)
*H01L 25/18* (2006.01)
*H01L 25/00* (2006.01)

(52) U.S. Cl.
CPC ...... *H01L 33/0075* (2013.01); *H01L 33/0093* (2020.05); *H01L 33/32* (2013.01); *H01L 33/382* (2013.01); *H01L 33/42* (2013.01); *H01L 33/44* (2013.01); *H01L 33/505* (2013.01); *H01L 33/62* (2013.01); *H01L 2933/0016* (2013.01); *H01L 2933/0025* (2013.01); *H01L 2933/0033* (2013.01); *H01L 2933/0066* (2013.01)

(56) References Cited

U.S. PATENT DOCUMENTS 9,281,446 B2 * 3/2016 Suh, II ................ H01L 33/0025
2008/0067562 A1 * 3/2008 Kawasaki ........... H01L 29/4175
257/289
2013/0048940 A1 * 2/2013 Sills ................ H01L 31/022441
257/13
2014/0034984 A1 * 2/2014 Schweeger ........... H01L 33/486
257/98
2016/0141446 A1 * 5/2016 Huang ................ H01L 33/0093
438/27

FOREIGN PATENT DOCUMENTS

| EP | 0 683 527 A1 | 11/1995 |
| EP | 2 495 772 A1 | 9/2012 |
| EP | 3 070 752 A1 | 9/2016 |
| FR | 2 985 989 A1 | 7/2013 |
| WO | WO 2014/140505 A1 | 9/2014 |
| WO | WO 2016/087542 A1 | 6/2016 |

OTHER PUBLICATIONS

International Search Report and Written Opinion for International Application No. PCT/EP2017/084776, dated Mar. 19, 2018.

* cited by examiner

OPTOELECTRONIC DEVICE WITH LIGHT-EMITTING DIODES

This application is a national stage filing under 35 U.S.C. § 371 of International Patent Application Serial No. PCT/EP2017/084776, filed Dec. 28, 2017, which claims priority to French patent application FR16/63509, filed Dec. 29, 2016. The entire contents of these applications are incorporated herein by reference in their entireties.

BACKGROUND

The present disclosure relates to an optoelectronic device, particularly a display screen or an image projection device, with light-emitting diodes based on semiconductor materials and their manufacturing methods.

DISCUSSION OF THE RELATED ART

A pixel of an image corresponds to the unit element of the image displayed by the optoelectronic device. When the optoelectronic device is a color image display optoelectronic device, it generally comprises for the display of each pixel of the image at least three components, also called display sub-pixels, which each emit a light radiation substantially in a single color (for example, red, green, and blue). The superposing of the radiations emitted by the three display sub-pixels provides the observer with the color sensation corresponding to the pixel of the displayed image. In this case, the assembly formed by the three sub-display pixels used to display a pixel of an image is called display pixel of the optoelectronic device.

There exist optoelectronic devices comprising light-emitting diodes based on semiconductor materials comprising a stack of semiconductor layers for example comprising at least one group-III element and one group-V element, called III-V compound hereafter, particularly gallium nitride (GaN).

Blocks of photoluminescent materials can be formed on the stack of semiconductor layers. Each block is adapted to convert the radiation emitted by the light-emitting diodes into a desired radiation. The blocks are located on the stack of semiconductor layers according to the subpixel arrangement.

In an image display device, crosstalk occurs when the light emitted by the light-emitting diode associated with one subpixel reaches the photoluminescent block associated with another subpixel. In order to reduce the cross-talk between subpixels, it is known to provide opaque or reflecting walls between the photoluminescent blocks. The walls can be made by electroplating techniques. However, these techniques do not generally allow to form walls with an aspect ratio that is adapted to the dimensions of the subpixels and the photoluminescent blocks.

SUMMARY

An object of an embodiment aims at overcoming all or part of the disadvantages of the previously-described optoelectronic devices comprising light-emitting diodes.

Another object of an embodiment is that the crosstalk between adjacent subpixels is reduced.

Another object of an embodiment is that the light-emitting diodes comprise a stack of semiconductor layers, for example mainly comprising a III-V compound.

Another object of an embodiment is that the wall shall form a cavity to accommodate the color conversion layer in the case when native colors of red, green and blue are not present in the same block from the light-emitting diodes. In the case of native colors of red, green and blue are present in the same block from light-emitting diodes, for example mainly comprising a III-V compound, the wall shall act as sub-pixel for the pixel block.

Thus, an embodiment provides a method of manufacturing an optoelectronic device, comprising the successive steps of:

a) providing a substrate at least partially made of a semiconductor material and having first and second opposite faces;

b) forming a stack of semiconductor layers on the first face, said stack comprising third and fourth opposite faces, the fourth face being on the side of the substrate, said stack comprising light-emitting diodes;

c) bonding the stack (19), on the side of the third face (20), to an electronic circuit (14);

d) forming through openings in the substrate from the side of the second face, said openings being opposite at least part of the light-emitting diodes and delimiting walls in the substrate;

e) forming conductive pads on the fourth face in at least some of the openings in contact with the stack; and f) forming photoluminescent blocks in at least some of the openings.

According to an embodiment, step b) comprises forming a seed layer in contact with the substrate, the seed layer being made of a material favoring the growth of at least one of semiconductor layers of the stack.

According to an embodiment, the seed layer may be at least partially made of aluminum nitride, of aluminium gallium nitride, of aluminium indium gallium nitride, of aluminium indium nitride or of silicon nitride.

According to an embodiment, the substrate comprises a support covered by an electrically insulating layer, said electrically insulating layer being covered by a semiconductor base, and, at step b), the stack is formed on the semiconductor base, in contact with the semiconductor base.

According to an embodiment, step d) comprises etching completely the support and etching the openings through the insulating layer and the semiconductor base.

According to an embodiment, the method further comprises, before step c), the step of etching trenches in the stack, the trenches extending in the stack from the third face, and covering each trench with an electrically insulating coating.

According to an embodiment, the method further comprises, before step c), the step of implanting ions in the stack to form electrically insulating regions extending in the stack from the third face.

According to an embodiment, the method further comprises, before step b), forming openings in the substrate from the first face and forming the walls in said openings, the walls being at least made in part of a material different from the substrate, the method further comprising, in step d), removing the substrate to expose the walls.

Another embodiment provides an optoelectronic device comprising:

a stack comprising light-emitting diodes;

walls at least partially made of a semiconductor or electrically insulating material resting on the stack, said walls delimiting openings, said openings being opposite at least part of the light-emitting diodes;

electrically conductive pads in at least some of the openings in contact with the stack; and photoluminescent blocks in at least some of the openings.

According to an embodiment, the optoelectronic device further comprises, between the walls and the stack, seed portions in contact with the walls and the stack, the seed portions being made of a material favoring the growth of at least one of the semiconductor layers of the stack.

According to an embodiment, the seed portions may be at least partially made of aluminum nitride, of aluminium gallium nitride, of aluminium indium gallium nitride, of aluminium indium nitride or of silicon nitride.

According to an embodiment, the optoelectronic device further comprises electrically insulating portions on top of the walls.

According to an embodiment, the optoelectronic device further comprises, trenches extending in the stack, each trench being covered with an electrically insulating coating.

According to an embodiment, the optoelectronic device further comprises electrically insulating regions extending in the stack.

According to an embodiment, the stack comprises a face which is roughened or includes periodic patterns.

According to an embodiment, conductive pads are made of a material at least partially transparent to the radiation emitted by the light-emitting diodes.

According to an embodiment, the optoelectronic device further comprises electrical connections passing through the stack from the third face to the fourth face, said electrical connections being insulated from the semiconductor layers of the stack and being in contact with the walls.

According to an embodiment, each wall comprises a core of a semiconductor material covered with an electrically insulating layer.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
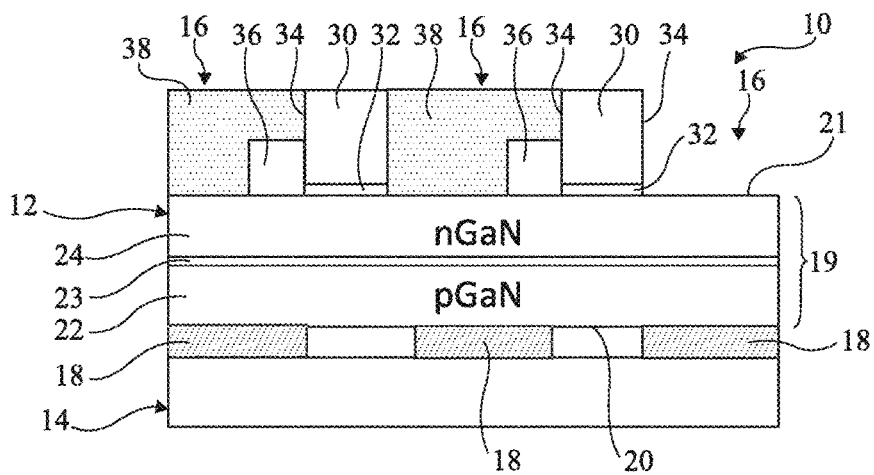
FIGS. 1 and 2 are respectively a simplified cross-section view and a top view of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing a light-emitting diode of an optoelectronic device are well known and will not be described.

In the following description, unless otherwise indicated, terms "substantially", "approximately", and "in the order of" mean "to within 10%". Moreover, "active area" of a light-emitting diode designates the region of the light-emitting diode from which most of the electromagnetic radiation provided by the light-emitting diode is emitted. Further, when a first element is said to be linked to a second element by an epitaxial relationship, this means that the first element is made from a first layer and the second element is made from a second layer that is grown by epitaxy on the first layer or inversely.

Further, term "particle" such as used in the context of the present disclosure should be understood in a broad sense and corresponds not only to compact particles more or less having a spherical shape but also to angular particles, to flattened particles, to flake-shaped particles, to fiber-shaped particles, or to fibrous particles, etc. It should be understood that the "size" of particles in the context of the present disclosure means the smallest transverse dimension of the particles. Particles of a material means the particles considered individually, that is, the unit elements of the material, knowing that the material may appear in the form of particle clusters. Phrase "average size" of particles means according to the present disclosure the arithmetic average of the particle sizes, that is, the sum of the particle sizes divided by the number of particles. The granulometry of the particles may be measured by laser granulometry by using, for example, a Malvern Mastersizer 2000.

Figure 2:
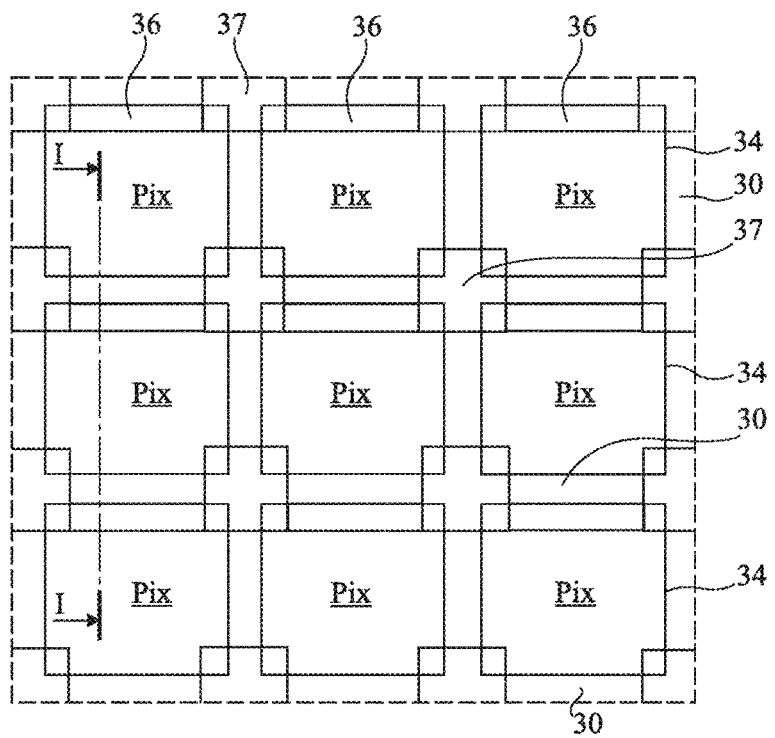

FIGS. 1 and 2 show an embodiment of an optoelectronic device 10, for example corresponding to a display screen or to an image projection device.

Device 10 comprises two integrated circuits 12, 14. First integrated circuit 12 comprises light-emitting diodes 16 and is called optoelectronic circuit or optoelectronic chip in the following description. Second integrated circuit 14 comprises electronic components, not shown, especially transistors, used to control the light-emitting diodes 16 of first integrated circuit 12. Second integrated circuit 14 is called control circuit or control chip in the following description. Optoelectronic circuit 12 is bonded to control circuit 14. According to the bonding type, bounding pads 18 may be present between optoelectronic chip 12 and control chip 14.

According to an embodiment, light-emitting diodes 16 are formed by a stack 19 of semiconductor layers having two opposite faces 20, 21. The stack 19 comprises, from bottom to top in FIG. 1:

a doped semiconductor layer 22 of a first conductivity type, for example, P-type doped, and delimiting face 20;

an active area 23; and a doped semiconductor layer 24 of a second conductivity type opposite to the first conductivity type, for example, N-type doped, and delimiting face 21.

Optoelectronic circuit 12 also comprises walls 30 on layer 24. Walls 30 rest on a seed portions 32 interposed between walls 30 and layer 24. Seed portions 32 are in contact with face 21 of layer 24 and in contact with walls 30. Walls 30 delimit openings 34 that expose parts of face 21. According to an embodiment, walls 30 form a grid and openings 34 are arranged in rows and columns. As an example, nine sub-pixels Pix are shown in FIG. 2. In the present embodiment, openings 34 have a square shape in FIG. 2. However, the shape of openings 34 may be different.

Contact pads 36 are located in each opening 34 in contact with face 21. Contact pads 36 are made in a conductive material. In the present embodiment, contact pads 36 may be opaque to the light emitted by light-emitting diodes 16. Preferably contact pads 36 only partially cover the exposed parts of face 21 in openings 34. In the present embodiment, for each subpixel Pix, contacts pads 36 are present at the four corners of opening 34 and some contacts pads 36 run along walls 30. Moreover, contact pads 36 of adjacent subpixels Pix may be connected the one with the other by a linking portion 37 that extends over wall 30 separating both subpixels Pix. As a variation, for each subpixel Pix, contact pads 36 may be arranged as a grid covering face 21.

Photoluminescent blocks 38 are located in at least some of the openings 34, in contact with face 21. Photoluminescent blocks 38 are not shown in FIG. 2. There may be no photoluminescent blocks in some openings 34. Each photoluminescent block 38 comprises phosphors capable of emitting light at a wavelength different from the wavelength of the light emitted by light-emitting diode 16 when they are excited by the light emitted by light-emitting diode 16 of subpixel Pix.

Optoelectronic circuit 12 is bonded to control circuit 14 on layer 22 side. According to an embodiment, one bounding pad 18 is provided for each subpixel Pix.

In operation, voltages are applied between contact pads 36 and bounding pads 18, so that, for each subpixel Pix, the part of active area 23 facing opening 34 of subpixel Pix emits light with an intensity that depends on the voltage applied between contact pad 36 and bounding pad 18 associated with subpixel Pix. Walls 30 reduce crosstalk between adjacent subpixels Pix.

According to an embodiment, exposed parts of face 21 in openings 34 can be roughened and/or patterned to improve light extraction.

Semiconductor layers 22, 24 are at least partly made of at least one semiconductor material. The semiconductor material may be silicon, germanium, silicon carbide, a III-V compound, a II-VI compound, or a combination of at least two of these compounds. The thickness of semiconductor layer 22 is in the range from 10 nm to 1 µm. The thickness of semiconductor layer 24 is in the range from 10 nm to 10 µm. When the thickness of layer 24 is reduced, crosstalk between sub-pixels is substantially reduced.

Semiconductor layers 22, 24 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Semiconductor layers 22, 24 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (0) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions. Preferably layer 24 is linked to seed portions 32 by an epitaxial relationship.

Active area 23 is the layer having most of the radiation supplied by light-emitting diode LED emitted therefrom. According to an example, the active area 23 may comprise confinement means. Active area 23 may comprise a single quantum well. It may then comprise a semiconductor material different from the semiconductor material forming semiconductor layers 22 and 24 and having a bandgap smaller than that of semiconductor layers 22 and 24. Active area 23 may comprise multiple quantum wells. It then comprises a stack of semiconductor layers forming an alternation of quantum wells and of barrier layers. It is for example formed of an alternation of GaN and InGaN layers having respective thicknesses from 3 nm to 20 nm (for example, 6 nm) and from 1 nm to 30 nm (for example, 2.5 nm). The GaN layers may be doped, for example, of type N or P. According to another example, the active layer may comprise a single InGaN layer, for example having a thickness greater than 10 nm. Preferably the layers of active area 23 are linked to layer 24 by an epitaxial relationship.

Walls 30 are at least partly made of at least one semiconductor material. The semiconductor material may be silicon, germanium, silicon carbide, a III-V compound, a II-VI compound, or a combination of at least two of these compounds. Preferably, walls 30 are made of a semiconductor material compatible with the manufacturing methods implemented in microelectronics. Walls 30 may be heavily doped, lightly-doped or non-doped. Preferably, walls 30 are made of single-crystal silicon.

The height of walls 30, measured in a direction orthogonal to face 21, is in the range from 500 nm to 200 µm, preferably from 5 µm to 30 µm. The thickness of walls 30, measured in a direction parallel to face 21, is in the range from 100 nm to 50 µm, preferably from 0.5 µm to 10 µm. In the view of FIG. 2, the area of opening 34 corresponds to the area of a square having a side ranging from 1 µm to 100 µm, preferably from 3 µm to 15 µm.

According to an embodiment, walls 30 can be made of a reflecting material or covered by a reflecting coating for the wavelength of the radiation emitted by the photoluminescent blocks 38 and/or light-emitting diodes 16.

Seed portions 32 are made of a material favoring the growth of semiconductor layer 24. The seed portion 32 can also act as a transition layer to facilitate less defects or cracking when growing semiconductor layer 24. As an example, the material forming seed portions 32 may be a III-nitride material. As an example, seed portions 32 may be made of aluminum nitride (AlN), of aluminium gallium nitride (AlGaN), of aluminium indium gallium nitride (AlInGaN), of aluminium indium nitride (AlInN) or of silicon nitride (SiN). Seed portions 32 may be doped with the same conductivity type as walls 30. The thickness of seed portions 32, measured in a direction orthogonal to face 21, is in the range from 1 nm to 10 µm, preferably between 50 nm and 3 µm. Preferably seed portions 32 are linked to walls 30 by an epitaxial relationship.

Contact pads 36 are made of a conductive material, for example a metal such as aluminum, titanium, nickel, gold, silver, copper, or zinc. The height of contact pads 36, measured in a direction orthogonal to face 21, is in the range from 5 nm to 10 µm. The thickness of contact pads 36, measured in a direction parallel to face 21, is in the range from 1 nm to 100 µm. Contact pads 36 are in contact with semiconductor layer 24. Contact pads 36 may also be in contact with walls 30.

Each photoluminescent block 38 comprises particles of at least one photoluminescent material. An example of a photoluminescent material is yttrium aluminum garnet (YAG) activated by the trivalent cerium ion, also called YAG:Ce or YAG:Ce$^{3+}$. The average size of the particles of conventional photoluminescent materials is generally greater than 5 µm.

In an embodiment, each photoluminescent block 38 comprises a matrix having nanometer-range monocrystalline particles of a semiconductor material, also called semiconductor nanocrystals hereafter, dispersed therein. The internal quantum efficiency $QY_{int}$ of a photoluminescent material is equal to the ratio of the number of emitted photons to the number of photons absorbed by the photoluminescent substance. Internal quantum efficiency $QY_{int}$ of the semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum boxes.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide (AgInS$_2$), and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

The matrix typically consists of an encapsulant mixed with photoluminescence material, such as phosphor, submicron phosphor and nanocrystal material to form photoluminescence block 38. The matrix is made of an at least partly transparent material. The matrix is for example made of silica. The matrix is for example made of any at least partly transparent plastic material, particularly of an at least partly transparent polymer, particularly of silicone or of polyacetic acid (PLA) or poly(methyl methacrylate) (PMMA). The matrix may be made of an at least partly transparent polymer used with three-dimensional printers, such as PLA. According to an embodiment, the matrix contains from 2% to 90%, preferably from 10% to 60%, by mass of nanocrystals, for example, approximately 20% by mass of nanocrystals.

The height of photoluminescent blocks 38, measured in a direction orthogonal to face 21, is in the range from 100 nm to 1 mm. The height of photoluminescent blocks 38 is preferably inferior to the sum of the height of walls 30 and seed portions 32.

Figure 3:
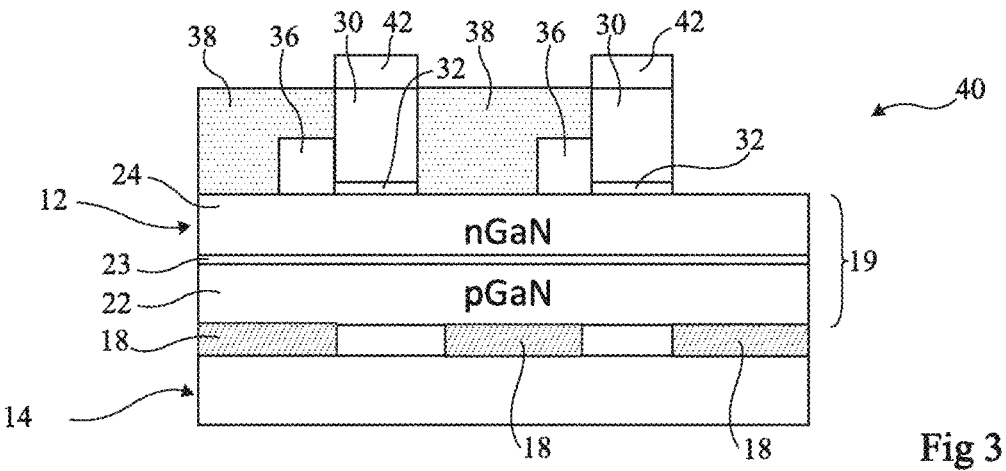
FIGS. 3 to 6 are partial simplified cross-section views of other embodiments of optoelectronic devices.

FIG. 3 is a partial simplified cross-section view of an embodiment of an optoelectronic device 40 comprising light-emitting diodes. Optoelectronic device 40 comprises the same elements as optoelectronic device 10 shown in FIG. 1, and also comprises insulating portions 42 covering the top of walls 30. Insulating portions 42 may correspond to a leftover from a substrate used to form walls 30, as it disclosed hereafter.

Insulating portions 42 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (particularly of general formula SiO$_x$N$_y$, for example, Si$_2$ON$_2$), of aluminum oxide (Al$_2$O$_3$), of hafnium oxide (HfO$_2$), or of diamond. The thickness of insulating portions 42, measured in a direction orthogonal to face 21, is in the range from 10 nm to 10 µm.

Figure 4:
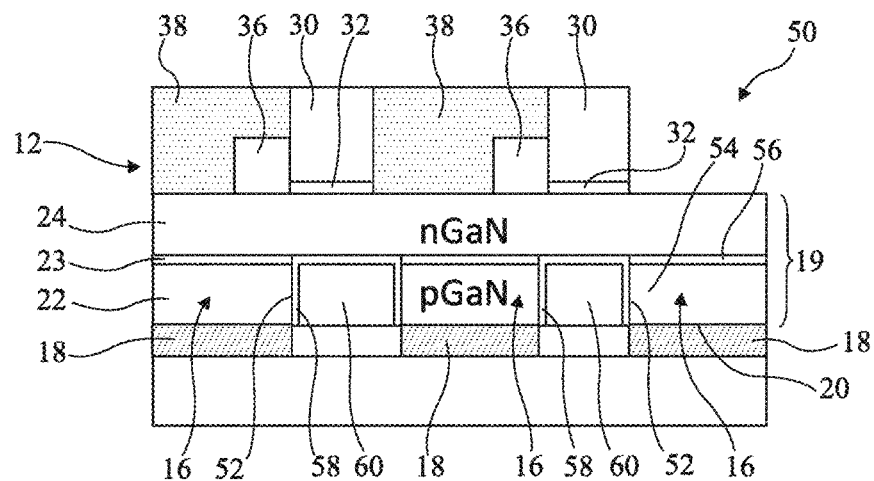

FIG. 4 is a partial simplified cross-section view of an embodiment of an optoelectronic device 50 comprising light-emitting diodes. Optoelectronic device 50 comprises the same elements as optoelectronic device 10 shown in FIG. 1, and also comprises trenches 52 extending through stack 19 from face 20. Trenches 52 extend at least through the complete thickness of layer 22 and active area 23. Trenches 52 may not extend through layer 24 or extend partially or completely through layer 24. Trenches 52 may also extend through seed portions 32, over all of part of the thickness of seed portions 32. Trenches 52 may also extend through walls 30, over all of part of the height of walls 30.

Trenches 52 delimit, for each light-emitting diode 16, a block comprising a portion 54 of layer 22 and a portion 56 of active area 23. Each trench 52 is covered with an electrically insulating layer or coating 58. Trenches 52 may be filled with a filling material 60. Filing material 60 may be an opaque, reflective or transparent layer, or a combination of the said material characteristics. Trenches 52 are preferably located in line with walls 30. Trenches 52 further reduce crosstalk between adjacent subpixels Pix.

The thickness of trenches 52, measured in a direction parallel to face 21, is in the range from 10 nm to 10 µm. The thickness of trenches 52 may be substantially equal to the thickness of walls 30. The thickness of insulating layer 58 is in the range from 1 nm to 10 µm. Insulating layer 58 may be made of the same materials as previously-described for insulating portions 42. The filling material 60 may be chosen from the group comprising epoxy, resin, silicone, metallic layer, dielectric, or air.

In another embodiment, optoelectronic circuit 12 may comprise electrical connections (via) passing completely through stack 19 and insulated from the layers of stack 19. Electrical connections may be, at one end, in contact with walls 30, and, at the opposite end, in contact with some of pads 18, these pads 18 being in that case insulated from layer 22. Preferably, contact pads 36 are in contact with walls 30 and voltages may be applied to contact pads 36 by control circuit 14 by means of said electrical connections. When previously-disclosed trenches 52 are present, electrical connections may be made by using a filling material 60 which is electrically conductive.

Figure 5:
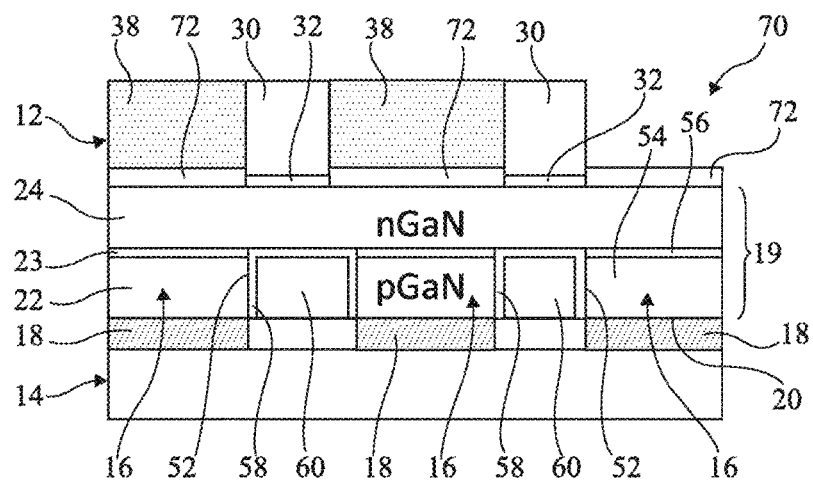

FIG. 5 is a partial simplified cross-section view of an embodiment of an optoelectronic device 70 comprising light-emitting diodes. Optoelectronic device 70 comprises the same elements as optoelectronic device 50 shown in FIG. 4 with the difference that each contact pad 36 is replaced with an electrically conductive layer 72 that is at least partially transparent to the electromagnetic radiation emitted by light-emitting diodes 16. Conductive layer 72 may cover the totality of the exposed part of face 21 delimited by walls 30 for each subpixel. Conductive layer 72 may be made of a transparent and conductive material such as graphene or a transparent conductive oxide (TCO), for example, indium tin oxide (ITO), zinc oxide (ZnO) doped with either Al or Ga or both. As an example, conductive layer 72 has a thickness in the range from 5 nm to 500 nm, preferably from 20 nm to 50 nm.

Figure 6:
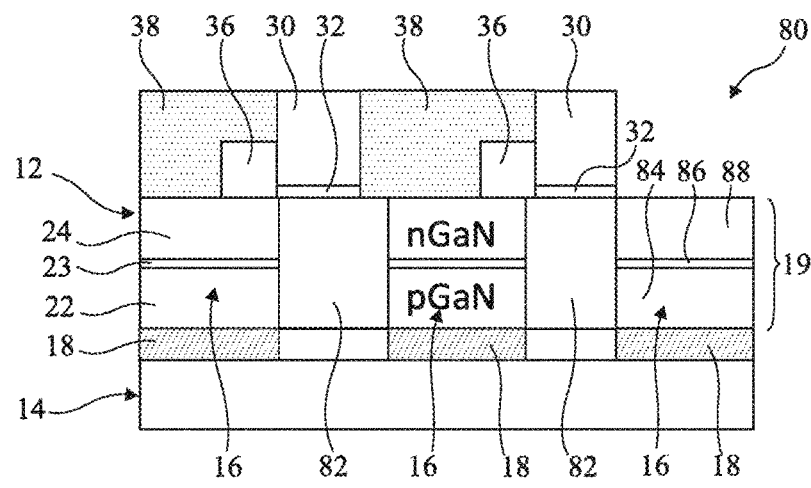

FIG. 6 is a partial simplified cross-section view of an embodiment of an optoelectronic device 80 comprising light-emitting diodes. Optoelectronic device 80 comprises the same elements as optoelectronic device 40 shown in FIG. 3, and also comprises electrically substantially electrically insulating areas 82 extending through stack 19 forming the light-emitting diodes from face 20. Insulating areas 82 extend at least through the total thickness of layer 22 and active area 23. Insulating areas 82 may not extend through layer 24 or extend partially or completely through layer 24. In FIG. 6, insulating areas 82 are shown extending completely through layer 24. Insulating areas 82 delimit, for each light-emitting diode 16, a block comprising a portion 84 of layer 22, a portion 86 of active area 23, and if applicable a portion 88 of layer 24. Insulating areas 82 can be formed by ion implantation in stack 19, and are typically created by ion implanting a non-electrically active species such as N or Ar to create lattice damage. The dosage is designed to create sufficient damage to result in high resistivity. Insulating areas 82 are preferably located in line with walls 30, but can also be wider or narrower than walls 30. Insulating areas 82 further reduce crosstalk between adjacent subpixels Pix.

The thickness of insulating areas 82, measured in a direction parallel to face 21, is in the range from 10 nm to 100 μm.

FIGS. 7A to 7E are partial simplified cross-section views of the structures obtained at successive steps of an embodiment of a method of manufacturing optoelectronic device 10 shown in FIG. 1.

Figure 7A:
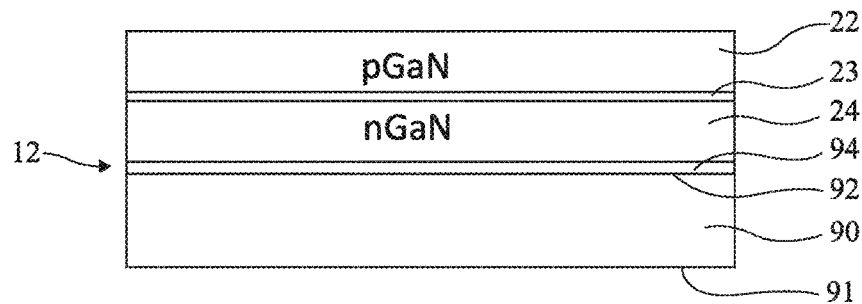
FIGS. 7A to 7E are partial simplified cross-section views of the structures obtained at successive steps of an embodiment of a method of manufacturing the optoelectronic device shown in FIG. 2.

FIG. 7A shows the structure obtained after the steps of:
providing a one-piece substrate 90 having two opposite faces 91, 92;
forming a seed layer 94 on face 92 of substrate 90;
forming layer 24 on seed layer 94;
forming active area 23 on layer 24; and
forming layer 22 on active area 23.

Substrate 90 is made of the same material as walls 30. Substrate 90 can also be a SOI substrate. Seed layer 94 is made of the same material as seed portions 32. Seed layer 94 may be obtained by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HYPE) may be used, as well as an atomic layer deposition (ALD) or physical vapor deposition (PVD). Further, methods such as evaporation or reactive cathode sputtering may be used. Seed layer 94 is made of a material favoring the growth of semiconductor layer 24. The seed layer 94 may also act as a stress relaxing layer to facilitate less defects or cracking when growing semiconductor layer 24.

Layer 24, active area 23 and layer 22 may be grown by a process of CVD, MOCVD, MBE, GSMBE, PAMBE, ALE, HVPE, ALD type.

Figure 7B:
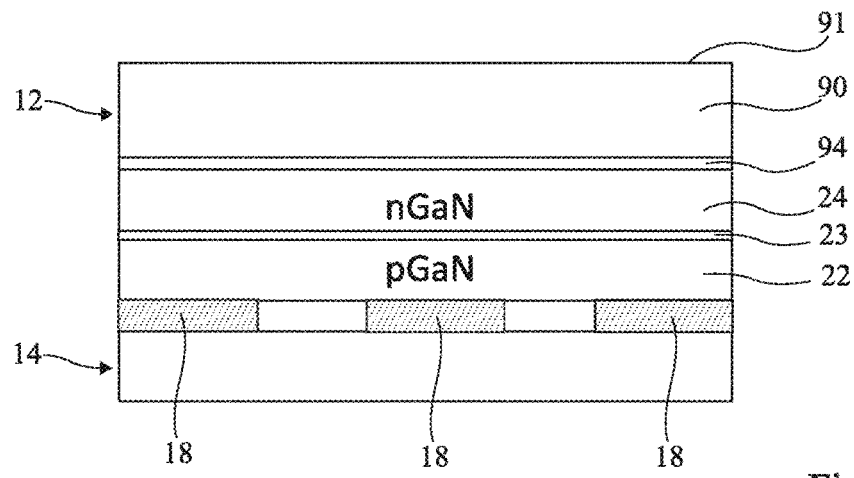

FIG. 7B shows the structure obtained after having bonded control chip 14 to optoelectronic chip 12 on the side of layer 22. In the present embodiment, the bonding of control chip 14 to optoelectronic chip 12 may be performed with use of inserts such as connection microbeads or stud bumping 18. Alternatively, the bonding of control chip 14 to optoelectronic chip 12 may be performed by direct bonding, with no use of inserts. The direct bonding may comprise a direct metal-to-metal bonding or eutectic bonding of metal areas of optoelectronic chip 12 and of metal areas of control chip 14. It can also be based on a dielectric-to-dielectric bonding of the dielectric areas at the surface of optoelectronic chip 12 and of the dielectric areas at the surface of control chip 14. The bonding of control chip 14 to optoelectronic chip 12 may be performed by a thermocompression method where optoelectronic chip 12 is placed against control chip 14, with a pressure and a heating being applied.

Figure 7C:
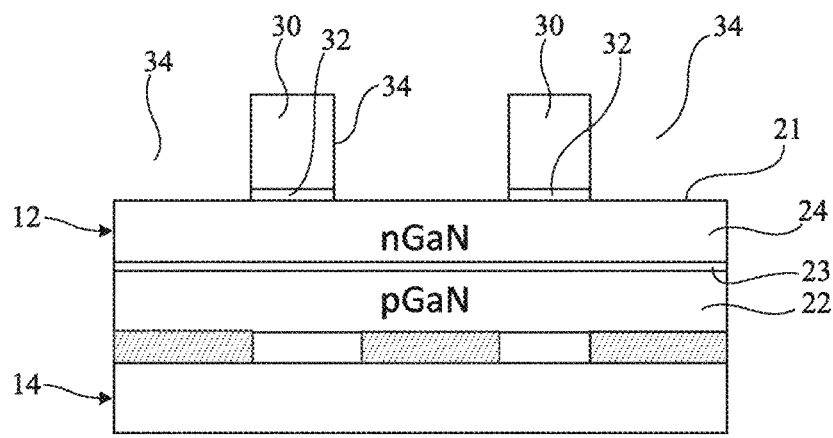

FIG. 7C shows the structure obtained after having etched openings 34 in substrate 90 from face 91 and seed layer 94 that expose parts of face 21 and delimit walls 30 and seed portions 32. The dimensions of openings 34 correspond to the desired dimensions of photoluminescent blocks 38. This etching is stopped on layer 24 or partially through layer 24. The surface morphology of layer 21 can be smooth, but can also be roughened or contain periodic features to improve light extraction efficiency. The implemented etching may be a dry etching, for example via a chloride or fluoride based plasma or an inductively coupled plasma etching (ICP), reactive ion etching (RIE), wet etching, chemical mechanical polishing or a combination of the said methods. In another embodiment, before the formation of openings 34, substrate 90 may first be thinned down, for example via chemical mechanical process (CMP), down to the wall height. Openings 34 are then etched using dry or wet etching process.

Figure 7D:
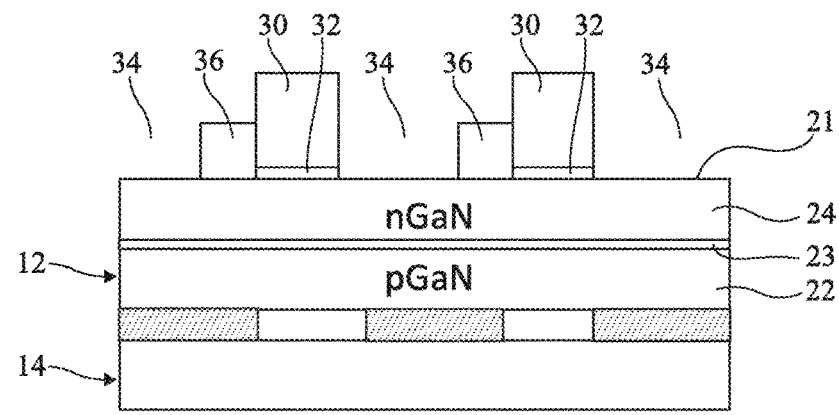

FIG. 7D shows the structure obtained after having formed contact pads 36. This may be obtained by conformally depositing an electrically conductive layer on face 21 inside the openings 34 and over walls 30, the conductive layer being made of the material of the contact pads 36, and by etching the conductive layer to delimit contact pads 36. The implemented etching may be a dry etching, for example via a chloride or fluoride based plasma based or a reactive ion etching (RIE). The contact pads 36 can also be formed via lift-off process.

Figure 7E:
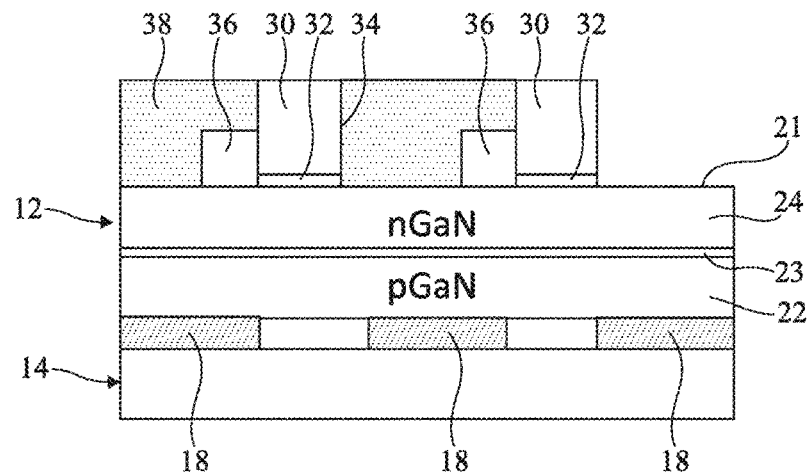

FIG. 7E shows the structure obtained after having formed photoluminescent blocks 38 inside at least some of openings 34. Photoluminescent blocks 38 may be formed by filling certain openings 34 with a colloidal dispersion of the semiconductor nanocrystals in a binding matrix, for example, by a so-called additive process, possibly by obstructing certain openings 34 with resin. The so-called additive process may comprise direct printing of the colloidal dispersion at the desired locations, for example, by inkjet printing, photogravure, silk-screening, flexography, spray coating, aerosol coating or drop casting.

FIGS. 8A to 8D are partial simplified cross-section views of the structures obtained at successive steps of an embodiment of a method of manufacturing optoelectronic device 40 shown in FIG. 3.

Figure 8A:
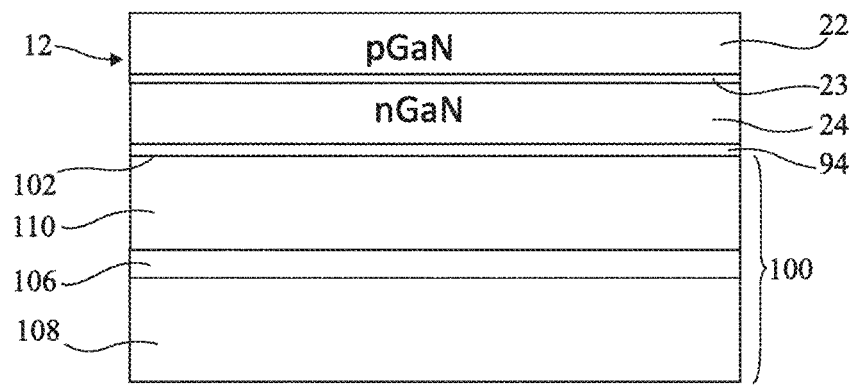
FIGS. 8A to 8D are partial simplified cross-section views of the structures obtained at successive steps of an embodiment of a method of manufacturing the optoelectronic device shown in FIG. 3.

FIG. 8A shows the structure obtained after the steps of:
forming seed layer 94 on a surface 102 of a SOI substrate 100;
forming layer 24 on seed layer 94;
forming active area 23 on layer 24; and
forming layer 22 on active area 23.

Substrate 100 may correspond to a multilayer structure comprising an insulating layer 106 covering a semiconductor base 108 and a semiconductor layer 110 covering insulating layer 106. Semiconductor layer 110 may be made of the same materials as previously described for walls 30. Insulating layer 106 may be made of the same materials as previously described for insulating portions 42.

Figure 8B:
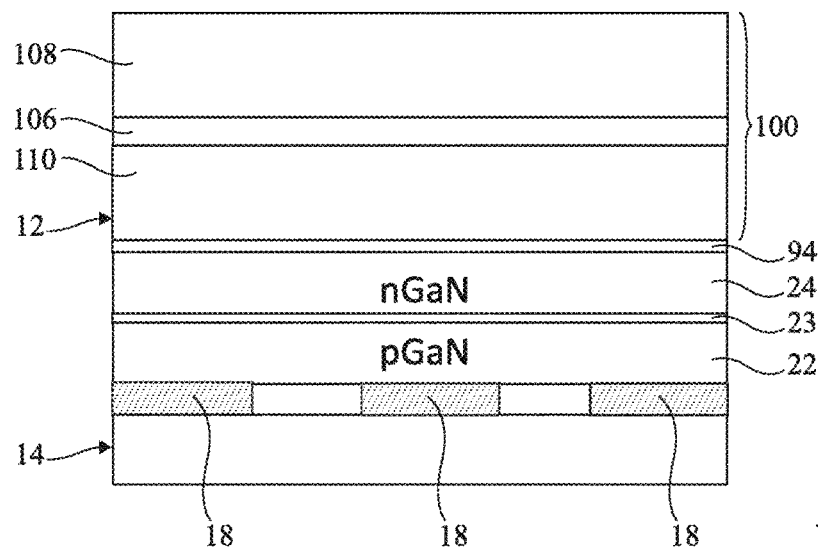
Figure 8C:
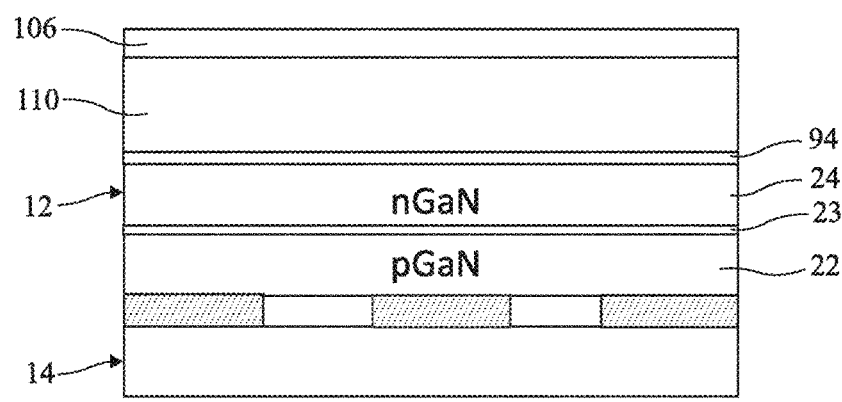

FIG. 8B shows the structure obtained after having bonded control chip 14 to optoelectronic chip 12 on the side of layer 22. It may be done as previously described in relation to FIG. 7B FIG. 8C shows the structure obtained after having etched semiconductor base 108. This etching is stopped on insulating layer 106. The implemented etching may be a dry etching, for example via plasma-based processes such as inductively coupled plasma (ICP) or reactive ion etching (RIE) using $Cl_2$ or $SF_6$ chemistry, or wet chemical etching. Wafer thinning via chemical mechanical polishing (CMP) can also be employed to thin down the substrate prior to the dry/wet etching process.

Figure 8D:
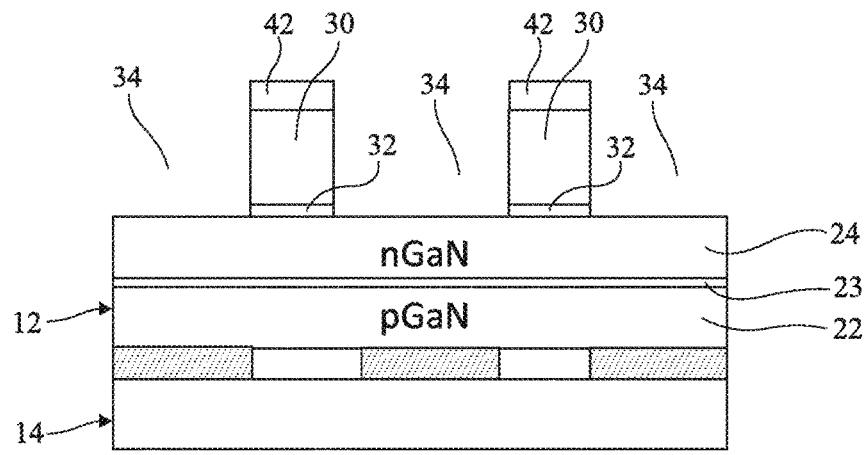

FIG. 8D shows the structure obtained after having etched openings 34 in insulating layer 106, semiconductor layer 110 and seed layer 94 in order to form, for each pixel, that expose parts of face 21 and delimit insulating portions 42, walls 30 and seed portions 32. The implemented etching may be a dry etching, for example via a plasma based on $Cl_2$ or a reactive ion etching (RIE) or wet etching.

The subsequent steps of the method may be those that have been previously described in relation with FIGS. 7D and 7E.

An embodiment of a method of manufacturing optoelectronic device 50 shown in FIG. 4 may comprise the steps previously described in relation with FIG. 7A to 7E and further comprise, before the step of bonding control chip 14 to optoelectronic chip 12, the step of etching trenches 52 at least in layer 22 and active area 23, and possibly in layer 24, in seed portions 32 and in walls 30, forming insulating layer 58 inside trenches 52 and filling trenches 52 with filling material 60.

An embodiment of a method of manufacturing optoelectronic device 80 shown in FIG. 6 may comprise the steps previously described in relation with FIG. 7A to 7E and further comprise, before the step of bonding control chip 14 to optoelectronic chip 12, the step of implanting ions inside stack 19 to form insulating areas 82.

Figure 9:
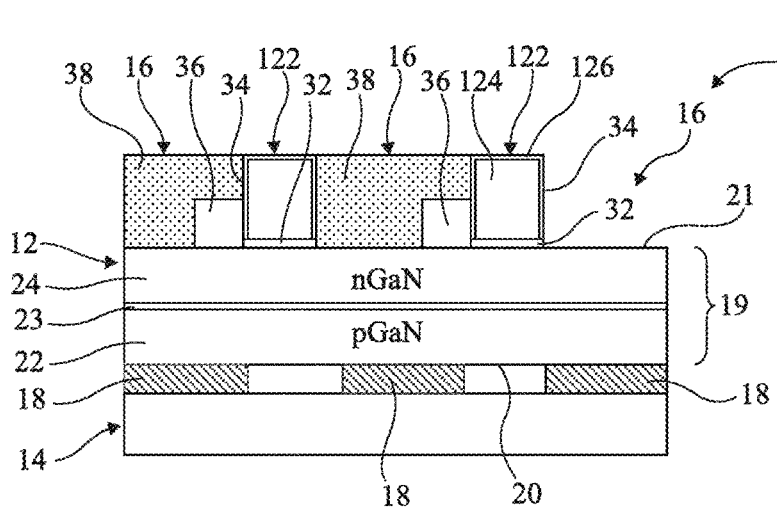
FIG. 9 is a partial simplified cross-section view of another embodiment of an optoelectronic device.

FIG. 9 is a partial simplified cross-section view analog to FIG. 1 of another embodiment of an optoelectronic device 120 comprising light-emitting diodes. Optoelectronic device 120 comprises the same elements as optoelectronic device 10 shown in FIG. 1 with the difference that walls 30 are replaced by walls 122 resting on seed portions 32, each wall 122 comprising a core 124 of a filler material covered with an electrically insulating layer 126. As a variation, for each wall 122, insulating layer 126 may not be present.

The dimensions of walls 122 may be the same as the dimensions of walls 30. Core 124 may be made of a semiconductor material, for example silicon, in particular polycrystalline silicon, or of an electrically insulating material, for example $SiO_2$. Insulating layer 126 may be made of a dielectric material, for example, of silicon oxide ($SiO_2$), of silicon nitride ($Si_xN_y$, where x is approximately equal to 3 and y is approximately equal to 4, for example, $Si_3N_4$), or of silicon oxynitride (particularly of general formula $SiO_xN_y$, for example, $Si_2ON_2$), or of hafnium oxide ($HfO_2$). Insulating layer 126 is for example made of thermal silicon oxide. The thickness of insulating layer 126 may be in the range from 50 nm to 1000 nm.

FIGS. 10A to 10G are partial simplified cross-section views of the structures obtained at successive steps of an embodiment of a method of manufacturing optoelectronic device 120 shown in FIG. 9.

Figure 10A:
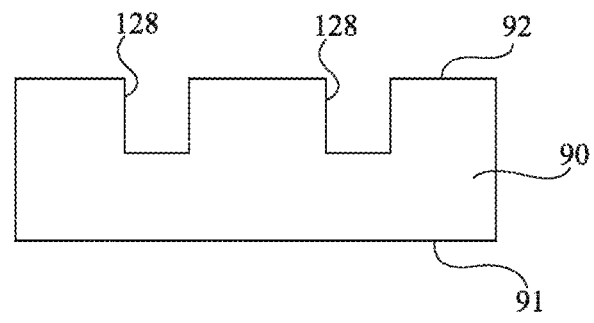
FIGS. 10A to 10G are partial simplified cross-section views of the structures obtained at successive steps of an embodiment of a method of manufacturing the optoelectronic device shown in FIG. 9.

FIG. 10A shows the structure obtained after the formation in substrate 90 of openings 128 from face 92 at the desired locations of walls 122. Openings 128 can be obtained by etching substrate 90, for example by dry etching.

Figure 10B:
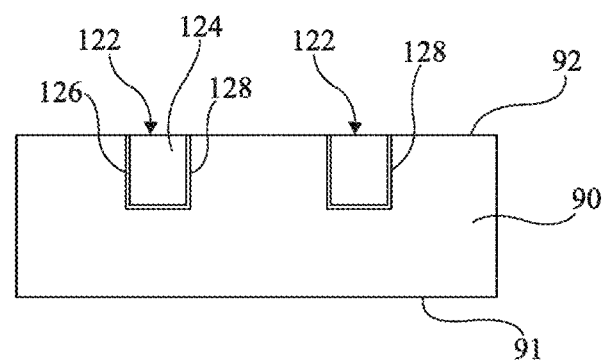

FIG. 10B shows the structure obtained after the formation, in each opening 128, of insulating layer 126 and insulating core 124. According to one embodiment, a layer of the material composing insulating layers 126 may be deposited in openings 128 and on the rest of face 92 of substrate 90 and a layer of the material composing cores 124 may be deposited on the entire structure, in particular to fill openings 128. The layer of the material composing insulating layers 126 and the layer of the material composing cores 124 are the removed, for example by etching, outside openings 128. Walls 122 are thus obtained. An advantage is that walls 122 having a high aspect ratio (ratio of the height and width of the walls) can be obtained with a reduced width. The outer layer of walls 122 in contact with substrate 90 is of a material that allows the implementation of a selective etching of substrate 90 with respect to walls 122 that is implemented at a later stage of the process. Thus, when substrate 90 is made of silicon, insulating layers 126 of walls 122 may be made of $SiO_2$. When substrate 90 is made of GaN or GaAs, layer 126 may not be present and walls 122 may be entirely made of silicon.

Figure 10C:
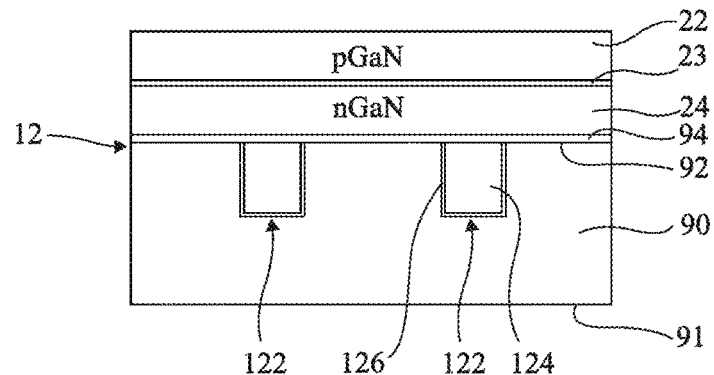

FIG. 10C shows the structure obtained after the same steps as those previously described in relation to FIG. 7A.

Figure 10D:
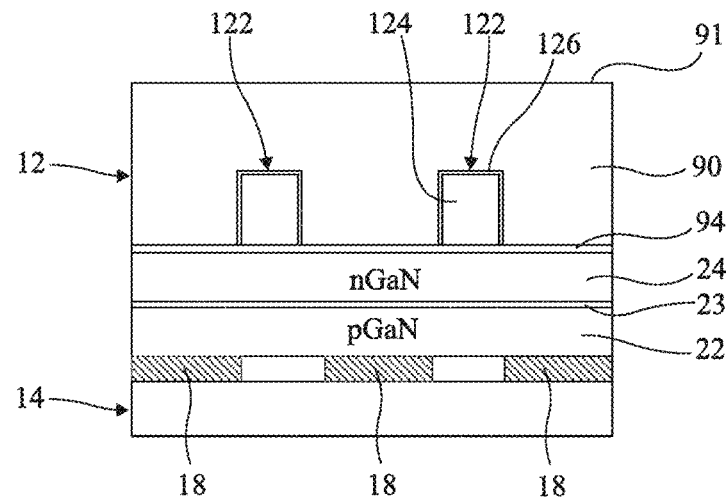

FIG. 10D shows the structure obtained after the same steps as previously described in relation to FIG. 7B.

Figure 10E:
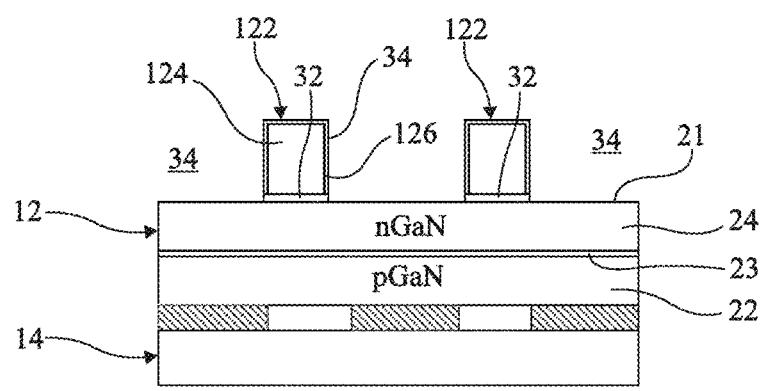

FIG. 10E shows the structure obtained after the withdrawal of substrate 90 to expose walls 122. The withdrawal of substrate 90 may be carried out in at least two steps, for example a first step of thinning substrate 90 from face 91, for example by mechanical polishing, this step being stopped before reaching insulating layers 126 and a second etching step, for example a chemical etching, to remove the rest of substrate 90. An advantage is that insulating layers 126 can act as a stop layer during etching of substrate 90.

Figure 10F:
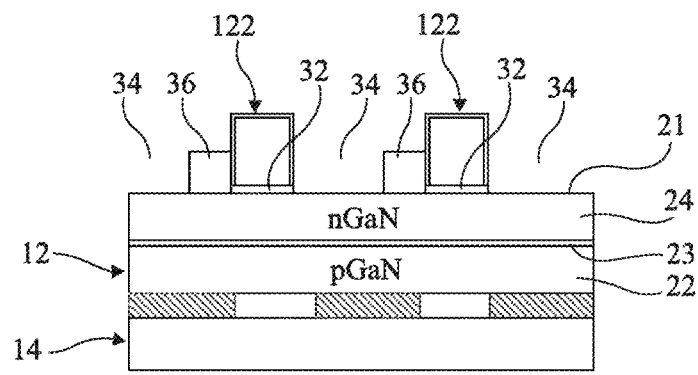

FIG. 10F shows the structure obtained after the same steps as previously described in relation to FIG. 7D.

Figure 10G:
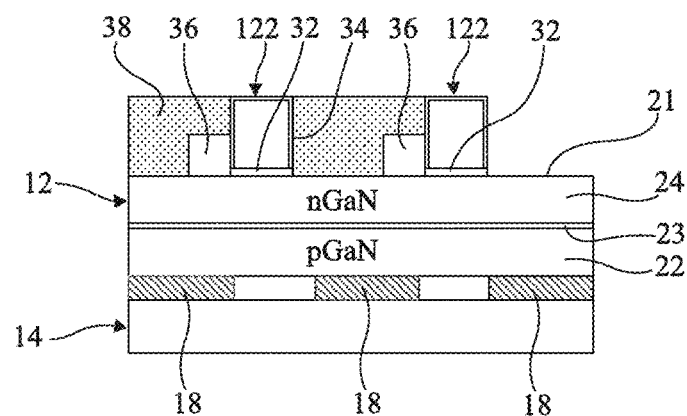

FIG. 10G shows the structure obtained after the same steps as those previously described in relation to FIG. 7E.

Specific embodiments have been described. Various alterations and modifications will occur to those skilled in the art. In particular, although in the previously-described embodiments, optoelectronic chip 12 is directly bonded to control chip 14, optoelectronic chip 12 and control chip 14 may be each bonded to a printed circuit. Moreover, although in the previously-described embodiments, the walls 30 have lateral faces that are substantially orthogonal to face 21, lateral faces of walls 30 may be profiled, for example inclined with respect to face 21.

Moreover, several embodiments with various alterations have been described. Some elements of these embodiments and alterations can be combined. As an example, in optoelectronic circuit 70 previously described in relation with FIG. 5, trenches 52 may not be present as it is the case for embodiments 10 and 40 previously described in relation with FIGS. 1 and 3.

The invention claimed is:

1. A method of manufacturing an optoelectronic device, comprising the successive steps of:
   a) providing a substrate at least partially made of a semiconductor material and having first and second opposite faces;
   b) forming a stack of semiconductor layers on the first face, said stack comprising third and fourth opposite faces, the fourth face being on the side of the substrate, said stack comprising light-emitting diodes;

c) bonding the stack, on the side of the third face, to an electronic circuit;

d) forming through openings in the substrate from the side of the second face, said openings being opposite at least part of the light-emitting diodes and delimiting walls in the substrate;

e) forming conductive pads on the fourth face in at least some of the openings in contact with the stack; and f) forming photoluminescent blocks in at least some of the openings.

2. The method of claim 1, wherein step b) comprises forming a seed layer in contact with the substrate, the seed layer being made of a material favoring the growth of at least one of semiconductor layers of the stack.

3. The method of claim 2, wherein the seed layer may be at least partially made of aluminum nitride (AlN), of aluminium gallium nitride (Alga), of aluminium indium gallium nitride (AlInGaN), of aluminium indium nitride (AlInN) or of silicon nitride (SiN).

4. The method of claim 1, wherein the substrate comprises a support covered by an electrically insulating layer, said electrically insulating layer being covered by a semiconductor base, and wherein, at step b), the stack is formed on the semiconductor base, in contact with the semiconductor base.

5. The method of claim 4, wherein step d) comprises etching completely the support and etching the openings through the insulating layer and the semiconductor base.

6. The method of claim 1, further comprising, before step c), the step of etching trenches in the stack, the trenches extending in the stack from the third face, and covering each trench with an electrically insulating coating.

7. The method of claim 1, further comprising, before step c), the step of implanting ions in the stack to form electrically insulating regions extending in the stack from the third face.

8. The method of claim 1, wherein the substrate prepared in step a) is a substrate comprising the semiconductor material and cores formed of a filler material which is different from the semiconductor material, wherein the cores are formed by etching openings in the first face so as to correspond to the desired location of the walls, and subsequently depositing a filler material in said openings; and wherein, in step d), forming through openings in the substrate is achieved by entirely removing the semiconductor material, such that the remaining cores define walls around said through openings.

9. An optoelectronic device comprising:
a stack comprising light-emitting diodes;
an electronic circuit bonded to the stack;
walls at least partially made of a semiconductor or electrically insulating material resting on the stack, said walls delimiting openings, said openings being opposite at least part of the light-emitting diodes;
electrically conductive pads in at least some of the openings in contact with the stack; and
photoluminescent blocks in at least some of the openings.

10. The optoelectronic device of claim 9, further comprising, between the walls and the stack, seed portions in contact with the walls and the stack, the seed portions being made of a material favoring the growth of at least one of the semiconductor layers of the stack.

11. The optoelectronic device of claim 10, wherein the seed portions may be at least partially made of aluminum nitride (AlN), of aluminium gallium nitride (AlGaN), of aluminium indium gallium nitride (AlInGaN), of aluminium indium nitride (AlInN) or of silicon nitride (SiN).

12. The optoelectronic device of claim 9, further comprising electrically insulating portions on top of the walls.

13. The optoelectronic device of claim 9, further comprising, trenches extending in the stack, each trench being covered with an electrically insulating coating.

14. The optoelectronic device of claim 9, further comprising electrically insulating regions extending in the stack.

15. The optoelectronic device of claim 9, wherein the stack comprises a face which is roughened or includes periodic patterns.

16. The optoelectronic device of claim 9, wherein conductive pads are made of a material at least partially transparent to the radiation emitted by the light-emitting diodes.

17. The optoelectronic device of claim 9, further comprising electrical connections passing through the stack from the third face to the fourth face, said electrical connections being insulated from the semiconductor layers of the stack and being in contact with the walls.

18. The optoelectronic device of claim 9, wherein each wall comprises a core of a semiconductor material covered with an electrically insulating layer.

\* \* \* \* \*